United States Patent [19]
Arnold et al.

[11] Patent Number: 5,307,071
[45] Date of Patent: Apr. 26, 1994

[54] LOW NOISE FREQUENCY SYNTHESIZER USING HALF INTEGER DIVIDERS AND ANALOG GAIN COMPENSATION

[75] Inventors: Keith P. Arnold, Canoga Park; Joel C. Blumke, Chatsworth, both of Calif.

[73] Assignee: Hughes Aircraft Company, Los Angeles, Calif.

[21] Appl. No.: 870,077

[22] Filed: Apr. 17, 1992

[51] Int. Cl.$^5$ .......................... G01S 7/03; H03L 7/08
[52] U.S. Cl. ................................ 342/103; 331/1 A; 331/25; 331/DIG. 2
[58] Field of Search ............... 342/102, 103; 331/1 A, 331/25, DIG. 2

[56] References Cited

U.S. PATENT DOCUMENTS

| | | |
|---|---|---|
| 4,313,209 | 1/1982 | Drucker . |
| 4,568,888 | 2/1986 | Kimura et al. ............... 331/25 X |
| 4,980,653 | 12/1990 | Shepherd .................. 331/25 X |
| 5,063,387 | 11/1991 | Mower ....................... 342/103 |

FOREIGN PATENT DOCUMENTS

| | | |
|---|---|---|
| 0344509 | 12/1989 | European Pat. Off. . |
| 0471487A1 | 2/1992 | European Pat. Off. . |
| 9111055 | 7/1991 | PCT Int'l Appl. . |
| 9202077 | 2/1992 | PCT Int'l Appl. . |
| 2097206 | 1/1982 | United Kingdom . |
| 2184617 | 6/1987 | United Kingdom . |

*Primary Examiner*—T. H. Tubbesing
*Attorney, Agent, or Firm*—Charles D. Brown; Randall M. Heald; Wanda Denson-Low

[57] ABSTRACT

A low noise frequency synthesizer 10 that uses uses frequency dividers 13, 15, at least one of which(divider 15) is incrementable and decrementable in half integer steps, and analog gain compensation in a phase/frequency detector 14 to achieve lower noise, lower spurious levels and faster switching speed than traditional methods of frequency synthesis. The key features of the present invention are its half integer dividers 13, 15 and the ability to adjust the phase detector gain to compensate the loop for varying divide numbers. The synthesizer 10 comprises two dividers 13, 15 that provide two reference frequency signals that are a function of an input signal and an output signal of the synthesizer 10. A voltage controlled oscillator (VCO) 18 provides the output signal ($f_O$) of the frequency synthesizer 10. A phase/frequency detector 14 compares the reference frequency signals and provides a phase error output signal that drives the VCO 18. A digital controller, comprising a PROM 11 and a digital to analog converter 12, adjusts the gain of the phase detector 14 to compensate for varying divide numbers, and selects the divide numbers. The synthesizer 10 has lower phase noise, lower spurious levels and faster frequency channel switching. To generate a frequency step of a given size, the divide number is half the step size. With a divide number of half the step size, the noise contribution from the divider is reduced by that much. The phase margin is improved with a corresponding reduction in loop peaking in the noise spectrum. A missile radar system employing the present synthesizer is also disclosed.

20 Claims, 2 Drawing Sheets

LOW NOISE FREQUENCY SYNTHESIZER USING HALF INTEGER DIVIDERS AND ANALOG GAIN COMPENSATION

BACKGROUND

The present invention relates generally to low noise frequency synthesizers, and more particularly, to a low noise frequency synthesizer using half integer dividers and analog gain compensation.

Traditional methods of frequency synthesis utilize either direct analog or indirect M over N, or pulse swallowing techniques. For missile applications, the size and volume constraints in the missile are incompatible with the direct analog synthesizers due to the large number and physically large sizes of all the frequency multipliers and high Q bandpass filters needed therein. Synthesizers employing normal M over N or pulse swallowing suffer primarily from higher spurious levels, so the design must be done very carefully.

Gain compensation is normally done by using a finite number of analog switches to switch in different resistor combinations to vary the loop gain. The drawback with this is only a finite number of steps are available and the resolution of these limited number of steps is gross. In addition the parasitic capacitances of these extra components can cause stability problems.

Accordingly, it would be an advantage in the frequency synthesizer art to have a low noise frequency synthesizer that provides for lower phase noise, lower spurious levels and faster switching speed than traditional methods of frequency synthesis.

SUMMARY OF THE INVENTION

In order to provide the the above and other advantages, the present invention provides for a low noise frequency synthesizer that uses at least one half integer frequency divider that is incremented and decremented in half integer steps, and an analog gain compensation scheme in a phase/frequency detector to achieve lower noise, lower spurious levels and faster frequency switching speed than traditional methods of frequency synthesis. The key features that are novel in the present invention are its use of half integer dividers and the ability to adjust the phase detector gain to compensate the loop for varying divide numbers.

More particularly, the present invention is a frequency synthesizer comprising a first half integer divider (incrementable and decrementable in half integer steps) that receives an input signal ($f_I$) and provides a first reference frequency signal ($f_R$) that is equal to the value of the input signal divided by a first divide number N. A voltage controlled oscillator (VCO) provides an output signal ($f_O$) of the frequency synthesizer.

A second half integer divider (incrementable and decrementable in half integer steps) receives the output signal ($f_O$) and provides a second reference frequency signal ($f_C$) that is equal to the value of the output signal ($f_O$) divided by a second divide number M. A phase/frequency detector compares the first and second reference frequency signals and provides a phase error output signal. A digital controller is provided that adjusts the gain of the phase detector to compensate for varying divide numbers, and selects the first and second divide numbers.

The digital controller typically comprises a programmable read only memory (PROM) that receives a digital frequency command word that selects a frequency by addressing a memory address location in the PROM, and a digital to analog converter that provides the gain control output voltage signal ($G_C$). Each address contains digital words that control the divide numbers M and N and the output voltage of the digital to analog converter. In addition, the frequency synthesizer may include a loop filter coupled between the phase/frequency detector means and the VCO, and a lock detect circuit coupled to the phase/frequency detector that provides an in-lock flag signal in response to an output signal of the phase/frequency detector.

The advantages of the present synthesizer using half integer dividers are lower phase noise, lower spurious levels and faster frequency channel switching. To generate a frequency step of a given size, the divide number is half the step size. With a divide number of half the step size, the noise contribution from the divider is reduced by that much. By providing half integer dividers employing a half-integer divide number (specifically M, and optionally M and N) also means that the frequency provided to the phase detector is twice as high. Therefore the phase margin is improved with a corresponding reduction in loop peaking in the noise spectrum, that provides for a lower noise contribution due to loop peaking. This reference signal "bleeds" through the phase detector, but at twice the frequency, and the loop attenuates this reference signal much better, yielding a synthesizer with lower spurious levels.

A higher reference frequency provides for greater loop gain and bandwidth. The higher gain means that noise of the VCO is degenerated to a large extent, that provides for a lower phase noise contribution due to the VCO. The wider loop bandwidth that is achieved, coupled with the combination phase/frequency detector, provides for very fast phase lock loop locking. The DAC controlled gain compensation of the phase detector compensates for the M divider variation very precisely, thereby eliminating loop peaking of the noise spectrum.

In addition, circuit complexity is reduced with a corresponding decrease in the size of the synthesizer and an improvement in reliability, while providing for the above-cited improved performance features. The improved frequency synthesizer of the present invention is compatible with traditional synthesizer methods and may be adapted to work in conjunction with these methods to yield further improvements.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
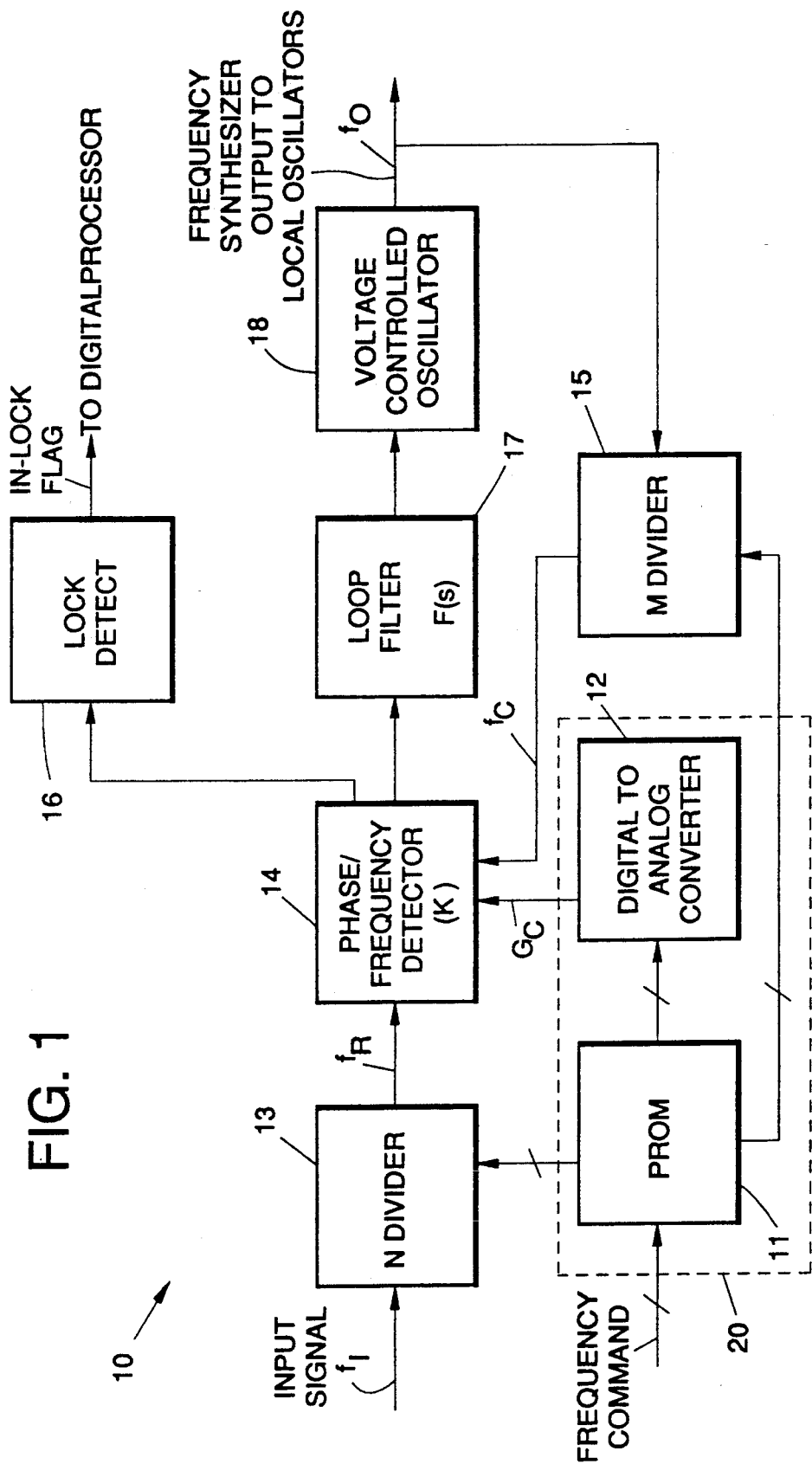
FIG. 1 illustrates a low noise frequency synthesizer using dividers and analog gain compensation in accordance with the principles of the present invention.

Referring to the drawings, FIG. 1 it shows a block diagram of a low noise phase locked loop frequency synthesizer 10 in accordance with the principles of the present invention. The synthesizer 10 is comprised of a digital controller 20 comprising a programmable read only memory (PROM) 11 and a digital to analog converter 12. The programmable read only memory (PROM) 11 is adapted to receive digital frequency commands. The PROM 11 is coupled to the digital to analog converter 12, and a divide by N divider 13 that is adapted to receive an input signal ($f_I$) and provide a first phase detector reference frequency signal ($f_R$).

The digital to analog converter 12 and divide by N divider 13 have outputs that are coupled to a phase/frequency detector 14. The digital to analog converter 12 provides a gain control output signal ($G_C$) to the phase/frequency detector 14. The PROM 11 is coupled to a divide by M divider 15 whose output is also coupled to the phase/frequency detector 14. The divide by M divider 15 provides a second phase detector reference frequency signal ($f_C$) to the phase/frequency detector 14.

Outputs of the phase/frequency detector 14 are coupled to a lock detect circuit 16 that provides an "in-lock" flag signal that is provided to a missile logic processor, for example, and to a loop filter 17 whose output is coupled to a voltage controlled oscillator (VCO) 18 that provides a frequency synthesizer output signal ($f_O$) of the synthesizer 10. The frequency synthesizer output signal is coupled as a feedback signal to the divide by M divider 15.

In operation, a digital frequency command word is provided to the PROM 11 to select the frequency that is used to address a location in the PROM 11. The contents of the PROM address location sets the ratio in the divide by N divider 13, the ratio in the divide by M divider 15, and the digital word provided to the digital to analog converter 12.

The divide by N divider 13 divides the input signal $f_I$ by N to generate $f_R$, that comprises a phase detector reference frequency. The phase/frequency detector 14 compares the phase of the reference frequency $f_R$ with the phase of the output signal $f_C$ of the divide by M divider 15, that comprises the frequency synthesizer output signal $f_O$ provided by the VCO 18 divided by M. The divide ratio M is determined by the contents of the PROM 11. The output of the phase/frequency detector 14 represents a phase error that is amplified and frequency shaped by the loop filter 17, in accordance with a filter transfer function F(s). The loop filter transfer function F(s) determines loop characteristics such as gain, bandwidth, spurious rejection, and lock time, and provides for a predetermined gain and frequency response of the phase locked loop, in a manner that is well-known to those skilled in the art.

The gain of the phase/frequency detector 14 ($K_D$) is controlled by the output voltage of the digital to analog converter 12. The output voltage of the digital to analog converter 12 is controlled with a resolution down to a millivolt, when a 12 bit digital to analog converter 12 is used. The fine continuous adjustment compensates exactly for the output frequency ($f_C$) provided by the divide by M divider 15 and therefore minimizes gain variation with varying M frequency values. This eliminates gain variation as a source of loop peaking.

When the loop is phase locked (as is indicated by the in-lock flag signal) the following equations are valid:

$$f_C = f_R, f_O = M \cdot f_R, \text{ and } f_O = f_I \cdot M/N.$$

M and/or N are allowed to be integers or half integers, which allows for a minimum frequency step size of ($f_I/N$)/2.

The phase noise of the synthesizer 10 is given by the equation:

$$L(f)_{OUT} = L(f)_{PD} \cdot \frac{F(s)K_V \cdot s}{1 + F(s)K_DK_V/s \cdot M} +$$

$$L(f)_{VCO} \cdot \frac{1}{1 + F(s)K_DK_V/S \cdot M} +$$

$$L(f)_{DIV} \cdot \frac{F(s)K_DK_V/S}{1 + F(s)K_DK_V/S \cdot M}$$

where the first term is the noise in the phase/frequency detector 14, the second term is the noise in the VCO 18, and the third term is the noise in the divider 13, and where F(s) is the transfer function of the loop filter 17, $K_V$ is the gain constant of the VCO 18, and $K_D$ is the gain of the phase detector 14. It may be observed from these equations that the noise may be reduced by making M smaller, which is done in the present half integer divider synthesizer 10.

Figure 2:
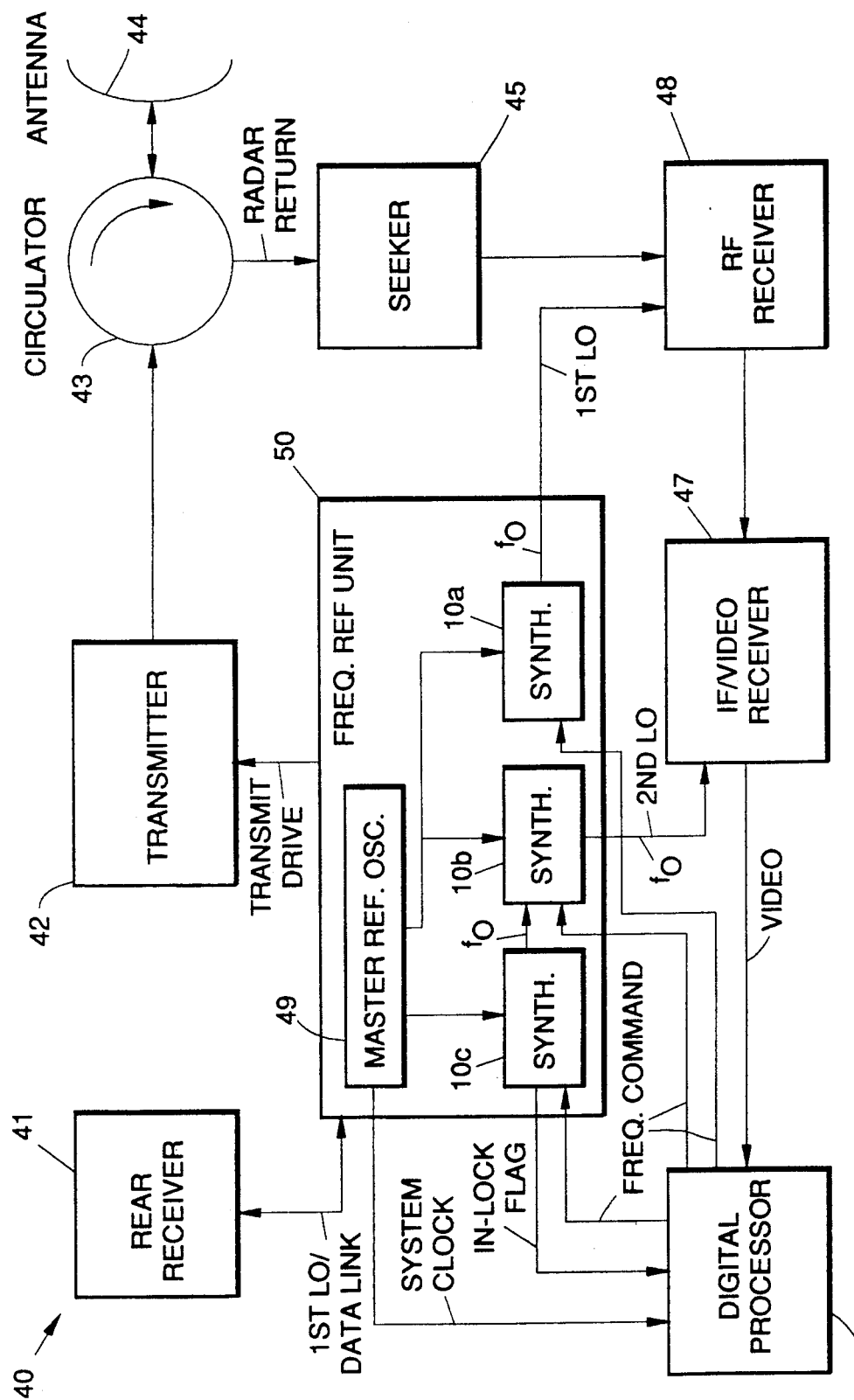
FIG. 2 shows a block diagram of a missile radar system employing the synthesizer of FIG. 1.

FIG. 2 shows a block diagram of a missile radar system 40 employing three synthesizers 10a, 10b, 10c shown in FIG. 1. The radar system 40 comprises a frequency reference unit 50 that includes a crystal oscillator 49 and the three synthesizers 10a, 10b, 10c. The crystal oscillator 49 provides clock signals to the three synthesizers 10a, 10b, 10c. The radar system 40 comprises a rear receiver 41 that is coupled to the frequency reference unit 50 by way of a local oscillator (LO) data link. The reference unit 50 is coupled to a transmitter 42 whose output is coupled by way of a circulator 43 to an antenna 44. Radar return signals are coupled to a seeker 45 that couples the return signals to a radio frequency (RF) receiver 48. A first local oscillator signal is coupled from a first synthesizer 10a to the RF receiver 48 for downconverting the radar return signals to an intermediate frequency. The RF receiver 48 has its output coupled to an IF/video receiver 47 and second local oscillator signals are coupled from a second frequency synthesizer 10b to the IF/video receiver 47 to complete the downconversion process. Video output signals are coupled from the IF/video receiver 47 to a digital processor 46 that receives system clock signals from the crystal oscillator 49, in-lock signals from a third frequency synthesizer 10c, and provides frequency commands to the three synthesizers 10a, 10b, 10c.

In operation, the rear receiver 41 receives command signals from a launching aircraft, for example, and couples the received command signals to the frequency reference unit 50 by way of the data link. The missile is guided in a conventional manner using the transmitter 42, antenna 44, seeker 45, RF receiver 48 and IF/video receiver 47. The three synthesizers 10a, 10b, 10c provide local oscillator signals to the RF receiver 49, the IF/video receiver 47 and to the digital processor 46, respectively. These signals provide for downconversion of received radar return signals that are processed to track a target and guide the missile toward the target. This processing is not germane to an understanding of the present invention and will not be described herein.

An embodiment of the frequency reference unit 50 employing the synthesizers 10a, 10b, 10c of the present invention was built and tested, and a summary of test results is as follows. Test results to date indicate greater than 10 dB improvement in phase noise and 16 dB improvement in spurious signals was achieved with the present synthesizer 10 when compared to an identical existing synthesizer not using half integer dividers.

Phase lock loop lock-up time has been cut approximately in half, lowering the value from about 35 microseconds for the existing frequency synthesizer unit, to about 15 microseconds for the modified version of the frequency reference unit 50. These extraordinary improvements have been achieved using synthesizers 10 that occupy less area, require lower power and provide higher reliability than conventional synthesizers employed in the existing frequency reference unit.

The advantages of the present frequency synthesizer 10 in using dividers 13, 15 that are incrementable in half integer steps are: lower phase noise, lower spurious levels and faster frequency channel switching. To generate a frequency step of a given size, the divide number M is chosen as half the step size. Using a divide number of half the step size, the noise contribution from the divider 15 is reduced by that factor.

By providing half integer dividers 13, 15 employing one half the divide number also means that the frequency provided to the phase/frequency detector 14 is twice as high. Therefore the phase margin is improved with a corresponding reduction in loop peaking in the noise spectrum, that provides for a lower noise contribution due to loop peaking. This reference signal "bleeds" through the phase/frequency detector 14, but at twice the frequency, and the loop attenuates this reference signal much better, yielding a synthesizer 10 with lower spurious levels.

A higher reference frequency provides for greater loop gain and bandwidth. The higher gain means that noise of the VCO 18 is degenerated to a large extent, that provides for a lower phase noise contribution due to the VCO 18. The wider loop bandwidth that is achieved, coupled with the combination phase/frequency detector 14, provides for very fast phase locked loop locking. The DAC controlled gain compensation of the phase/frequency detector 14 compensates for the M divider variation very precisely, thereby eliminating loop peaking of the noise spectrum.

In addition, the complexity of the synthesizer 10 is reduced with a corresponding decrease in size and an improvement in reliability, while providing for the above-cited improved performance features. The improved frequency synthesizer 10 is compatible with traditional synthesizer techniques and may be adapted to work in conjunction with these techniques to yield further improvements.

Thus there has been described a new and improved low noise frequency synthesizer using half integer dividers and analog gain compensation. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A frequency synthesizer comprising:
   a first divider for receiving an input signal ($f_I$) and providing a first reference frequency signal ($f_R$) that is equal to the value of the input signal divided by a first divide number N;
   a voltage controlled oscillator (VCO) that provides an output signal ($f_O$) of the frequency synthesizer;
   a second divider for receiving the output signal ($f_O$) of the frequency synthesizer, and for providing a second reference frequency signal ($f_C$) that is equal to the value of the output signal ($f_O$) divided by a second divide number M;
   phase/frequency detector means for comparing the first and second reference frequency signals $f_R$, $f_C$ and for providing a phase error output signal, and whose gain ($K_D$) is controlled by a gain control output voltage signal ($G_C$); and
   digital controller means for adjusting the gain of the phase detector means by providing the gain control output voltage signal ($G_C$) to compensate for varying divide numbers, and for selecting the first and second divide numbers.

2. The frequency synthesizer of claim 1 wherein the digital controller means comprises:
   a programmable read only memory (PROM) that receives a digital frequency command word that selects a frequency by addressing a memory address location in the PROM; and
   a digital to analog converter coupled to receive digital words from the PROM and provide the gain control output voltage signal ($G_C$) that adjusts the gain value of the phase/frequency detector means to compensate for varying divide numbers.

3. The frequency synthesizer of claim 2 which further comprises a loop filter coupled between the phase/frequency detector means and the VCO.

4. The frequency synthesizer of claim 2 which further comprises a lock detect circuit coupled to the phase/frequency detector that provides an in-lock flag signal in response to an output signal of the phase/frequency detector.

5. The frequency synthesizer of claim 1 which further comprises a loop filter coupled between the phase/frequency detector means and the VCO.

6. The frequency synthesizer of claim 5 which further comprises a lock detect circuit coupled to the phase/frequency detector that provides an in-lock flag signal in response to an output signal of the phase/frequency detector.

7. The frequency synthesizer of claim 1 which further comprises a lock detect circuit coupled to the phase/frequency detector that provides an in-lock flag signal in response to an output signal of the phase/frequency detector.

8. The frequency synthesizer of claim 1 wherein the second divider is a half integer divider is a half integer divider which provides the second reference frequency signal ($f_C$) that is incremented and decremented in half integer steps.

9. The frequency synthesizer of claim 8 wherein the first divider is a half integer divider which provides the first reference frequency signal ($f_R$) that is incremented and decremented in half integer steps.

10. A frequency synthesizer comprising:
    a programmable read only memory (PROM) that receives a digital frequency command word that selects a frequency by addressing a memory address location in the PROM;
    a voltage controlled oscillator (VCO) that provides an output signal ($f_O$) of the frequency synthesizer;
    a digital to analog converter coupled to receive digital words from the PROM and provide an gain control output voltage signal ($G_C$) that adjusts a phase detector gain value to compensate for varying divide numbers;
    a divide by N divider coupled to the PROM whose divider ratio is set by the PROM memory address location, that receives an input signal ($f_I$) and provides a phase detector reference frequency signal ($f_R$) that is equal to the value of the input signal divided by N;

a divide by M divider coupled to the PROM and coupled to receive the output signal ($f_O$) of the frequency synthesizer, whose divider ratio is set by the value in the PROM memory address location, and that provides a second phase detector reference frequency signal ($f_C$) that is equal to the value of the synthesizer output signal ($f_O$) divided by M;

a phase/frequency detector coupled to outputs of the digital to analog converter and divide by N divider and divide by M divider that compares the first and second phase detector reference frequency signals $f_R$, $f_C$ and provides an output signal that comprises a phase error signal, and wherein the gain ($K_D$) of the phase/frequency detector is controlled by the gain control output voltage signal ($G_C$) of the digital to analog converter; and a loop filter coupled between the phase/frequency detector and the VCO.

11. The frequency synthesizer of claim 10 which further comprises a lock detect circuit coupled to the phase/frequency detector that provides an in-lock flag signal in response to an output signal of the phase/frequency detector.

12. The frequency synthesizer of claim 10 wherein the divide by M divider is a half integer divider which provides the second reference frequency signal ($f_C$) that is incremented and decremented in half integer steps.

13. The frequency synthesizer of claim 12 wherein the divide by N divider is a half integer divider which provides the first reference frequency signal ($f_R$) that is incremented and decremented in half integer steps.

14. A frequency synthesizer comprising:
a programmable read only memory (PROM) that receives a digital frequency command word that selects a frequency by addressing a memory address location in the PROM;

a voltage controlled oscillator (VCO) that provides an output signal ($f_O$) of the frequency synthesizer;

a digital to analog converter coupled to receive digital words from the PROM and provide a gain control output voltage signal ($G_C$) that adjusts a phase detector gain value to compensate for varying divide numbers;

a divide by N divider coupled to the PROM whose divider ratio is set by the PROM memory address location, that receives an input signal ($f_I$) and provides a phase detector reference frequency signal ($f_R$) that is equal to the value of the input signal divided by N, and wherein N is adapted to be incremented and decremented in half integer steps;

a divide by M divider coupled to the PROM and coupled to receive the output signal ($f_O$) of the frequency synthesizer, whose divider ratio is set by the value in the PROM memory address location, and that provides a second phase detector reference frequency signal ($f_C$) that is equal to the value of the synthesizer output signal ($f_O$) divided by M, and wherein M is adapted to be incremented and decremented in half integer steps;

a phase/frequency detector coupled to outputs of the digital to analog converter, the divide by N divider, and the divide by M divider that compares the first and second phase detector reference frequency signals $f_R$, $f_C$ and provides an output signal that comprises a phase error signal, and wherein the gain ($K_D$) of the phase/frequency detector is controlled by the gain control output voltage signal ($G_C$) of the digital to analog converter;

a lock detect circuit coupled to the phase/frequency detector that provides an in-lock flag signal in response to an output signal of the phase/frequency detector; and a loop filter coupled between the phase/frequency detector and the VCO.

15. A missile radar system comprising:
a transmitter coupled by way of a circulator to an antenna;

a radio frequency receiver coupled by way of a seeker and the circulator to the antenna; and a digital processor coupled to the radio frequency receiver by way of a video receiver;

a frequency reference unit comprising a crystal oscillator for providing system clock signals to the digital processor, a first synthesizer for providing a first local oscillator signal to the radio frequency receiver for downconverting radar return signals to intermediate frequency signals, and second and third frequency synthesizers for providing a second local oscillator signal to the video receiver to downconvert the intermediate frequency signals for processing by the digital processor, wherein the third frequency synthesizer provides in-lock signals to the digital processor, and wherein the digital processor provides frequency command signals to the third synthesizer;

wherein at least one frequency synthesizer comprises:
a first divider for receiving an input signal ($f_I$) and providing a first reference frequency signal ($f_R$) that is equal to the value of the input signal divided by a first divide number N;

a voltage controlled oscillator (VCO) that provides an output signal ($f_O$) of the frequency synthesizer;

a second divider for receiving the output signal ($f_O$) of the frequency synthesizer, for providing a second reference frequency signal ($f_C$) that is equal to the value of the output signal ($f_O$) divided by a second divide number M;

phase/frequency detector means for comparing the first and second reference frequency signals $f_R$, $f_C$ and for providing a phase error output signal, and wherein a gain ($K_D$) of the phase/frequency detector is controlled by the gain control output voltage signal ($G_C$) of a digital to analog converter; and digital controller means for adjusting the gain of the phase detector means to compensate for varying divide numbers, and for selecting the first and second divide numbers.

16. The missle radar system of claim 15 wherein the digital controller means comprises:
a programmable read only memory (PROM) that receives a digital frequency command word that selects a frequency by addressing a memory address location in the PROM; and a digital to analog converter coupled to receive digital words from the PROM and provide the gain control output voltage signal ($G_C$) that adjusts the gain value of the phase/frequency detector means to compensate for varying divide numbers.

17. The missle radar system of claim 15 which further comprises a loop filter coupled between the phase/frequency detector means and the VCO.

18. The missle radar system of claim 15 which further comprises a lock detect circuit coupled to the phase/frequency detector that provides an in-lock flag signal in response to an output signal of the phase/frequency detector.

19. The missle radar system of claim 15 wherein the second divider is a half integer divider which provides the second reference frequency signal ($f_C$) that is incremented and decremented in half integer steps.

20. The missle radar system of claim 19 wherein the first divider is a half integer divider which provides the first reference frequency signal ($f_R$) that is incremented and decremented in half integer steps.

* * * * *